United States Patent
Ji et al.

(10) Patent No.: US 11,894,483 B2
(45) Date of Patent: Feb. 6, 2024

(54) LASER RAPID FABRICATION METHOD FOR FLEXIBLE GALLIUM NITRIDE PHOTODETECTOR

(71) Applicant: BEIJING UNIVERSITY OF TECHNOLOGY, Beijing (CN)

(72) Inventors: Lingfei Ji, Beijing (CN); Weigao Sun, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 17/864,324

(22) Filed: Jul. 13, 2022

(65) Prior Publication Data

US 2023/0032584 A1 Feb. 2, 2023

(30) Foreign Application Priority Data

Aug. 2, 2021 (CN) .......................... 202110883036.9

(51) Int. Cl.
*H01L 31/18* (2006.01)
*H01L 31/0304* (2006.01)

(52) U.S. Cl.
CPC .... *H01L 31/1856* (2013.01); *H01L 31/03044* (2013.01); *H01L 31/1896* (2013.01)

(58) Field of Classification Search
CPC ........... H01L 31/1856; H01L 31/03044; H01L 31/1896; H01L 31/108; H01L 31/1852;
(Continued)

(56) References Cited

U.S. PATENT DOCUMENTS

| 8,772,144 B2 * | 7/2014 | Zhu ....................... H01L 29/417 438/572 |
| 2007/0093037 A1 | 4/2007 | Zhu |

(Continued)

FOREIGN PATENT DOCUMENTS

| CN | 101246820 A | 8/2008 |
| CN | 102790137 A | 11/2012 |

(Continued)

OTHER PUBLICATIONS

Search Report of the priority application CN202110883036.9.
(Continued)

*Primary Examiner* — Yasser A Abdelaziez
(74) *Attorney, Agent, or Firm* — J.C. PATENTS

(57) ABSTRACT

The invention provides a laser rapid fabrication method for flexible gallium nitride (GaN) photodetector which comprises the following steps: (1) bonding a flexible substrate to a GaN epitaxial wafer; (2) adjusting the focal plane position of a light beam, and ensuring that the light beam is incident from the side of a GaN epitaxial wafer substrate; (3) enabling the light beam to perform scanning irradiation from the edge of a sample structure obtained in the step (1); (4) adjusting the process parameters, and scanning irradiation in the reverse direction along the path in the step (3); (5) remove the original rigid transparent substrate of the epitaxial wafer to obtain a Ga metal nanoparticle/GaN film/ flexible substrate structure; and (6) preparing interdigital electrodes on the surfaces of the Ga metal nanoparticles obtained in the step (5). The flexible GaN photodetector with Ga metal nanoparticle in-situ distribution detection surface is prepared in one step through laser technology, the process is simplified, meanwhile, the surface of the detector is induced to form the surface plasmon resonance effect, the light absorption and light response performance is greatly (Continued)

enhanced, and the flexible gallium nitride photodetector is suitable for industrial production.

3 Claims, 1 Drawing Sheet

(58) Field of Classification Search
CPC . H01L 31/1892; Y02P 70/50; B23K 26/0624; B23K 26/082; B23K 26/702; B23K 2101/40
See application file for complete search history.

(56) References Cited

U.S. PATENT DOCUMENTS

| | | | |
|---|---|---|---|
| 2008/0041434 | A1 | 2/2008 | Adriani |
| 2014/0318611 | A1* | 10/2014 | Moslehi ............ H01L 31/0516 438/98 |

FOREIGN PATENT DOCUMENTS

| | | |
|---|---|---|
| CN | 103824905 A | 5/2014 |
| CN | 103839777 A | 6/2014 |
| CN | 108015410 A | 5/2018 |
| CN | 201811189141.7 | 2/2019 |
| CN | 109411552 A | 3/2019 |
| CN | 110047760 A | 7/2019 |
| CN | 111496384 A | 8/2020 |
| CN | 112382688 A | 2/2021 |
| CN | 202011106989.6 | 2/2021 |

OTHER PUBLICATIONS

Supplemental Search Report of the priority application CN202110883036.9.
International Search Report of the corresponding international application PCT/CN2021/121981.

* cited by examiner

LASER RAPID FABRICATION METHOD FOR FLEXIBLE GALLIUM NITRIDE PHOTODETECTOR

CROSS-REFERENCE TO RELATED APPLICATION

This application claims priority to Chinese application No. 202110883036.9, filed on Aug. 2, 2021, the content of which is hereby incorporated by reference in its entirety and made a part of this specification.

TECHNICAL FIELD

The invention belongs to the field of photodetection device preparation, in particular to a laser rapid fabrication method for flexible gallium nitride (GaN) photodetector.

BACKGROUND

Exposure is the most critical process link in chip manufacturing lithography technology, which requires a certain intensity of ultraviolet (UV) light to selectively irradiate the photoresist through the mask. The UV exposure dose will directly affect the surface and edge accuracy of the photoresist developed pattern, and ultimately affect the chip manufacturing quality. UV photodetector can effectively monitor UV exposure during the lithography process, and improve the lithography accuracy through feedback adjustment. At present, non-flexible UV photodetectors silicon-based UV photodiodes and photomultiplier tubes are mainly widely used, which are bulky and easily damaged. As a new generation of UV photodetectors, flexible GaN photodetectors have stable physical and chemical properties, small size and wide applicability compared to traditional rigid substrate detectors, and are more suitable for monitoring in high-end complex industrial environments such as chip production. Chinese patent application CN201811189141.1 adopts the method of tool peeling and mechanical transfer to separate GaN film from the substrate material to prepare a flexible GaN photodetector. This method has a high product damage rate and limited process controllability and precision. Chinese patent application CN202011106989.6 uses a pre-grown sacrificial layer and then chemical solution etching to transfer the prepared GaN functional device to a flexible substrate. Chemical solution etching is easy to cause environmental pollution, low removal efficiency, complex process, and is not suitable for mass production. Flexible photodetectors made by traditional methods have weak detection capabilities, and often need to be coated with nanoparticles to improve their detection performance with the help of plasmon polaritons enhancement effect. Therefore, the development of a new technology for rapid fabrication of high-performance GaN flexible photodetectors is of great significance for improving the lithography accuracy and even the quality of chip production in the semiconductor chip manufacturing process.

SUMMARY

In order to overcome the deficiencies of the prior art, the purpose of the present invention is to provide a laser rapid fabrication method for flexible GaN photodetector. The invention adopts the laser technology to realize the transfer of GaN film to flexible substrate while controlling the precipitation of in-situ growth of Ga metal nanoparticles, and prepares a flexible GaN photodetector with an in-situ distribution detection surface of the Ga metal nanoparticles in one step. The invention simplifying the device preparation process, and greatly enhance the light absorption and light response capabilities of the detector, and is suitable for large-scale batch industrial production.

The specific technical scheme of the present invention is: a laser rapid fabrication method for flexible GaN photodetector, comprising the following steps:

1) Flexible substrate is bonded to the epitaxial wafer of GaN thin film, wherein the epitaxial wafer of GaN film needs to be a rigid transparent substrate/GaN film structure, after bonding, a rigid transparent substrate/GaN film/flexible substrate structure is obtained;

2) Put the sample on processing table with a fixed height below the light outlet, adjust focus position of the laser beam so that its focal plane is within the range of 0.2 mm between the interface of rigid transparent substrate and the GaN film in rigid transparent substrate/GaN film/flexible substrate structure described in step 1), the spot size $l_0$ of focal plane is 5-100 μm, and the laser beam is guaranteed to be incident from the rigid transparent substrate side;

3) The laser wavelength is selected as 250-1200 nm, and the ultrafast laser with pulse width less than or equal to $10^{-12}$ s is selected, set the laser pulse frequency $f_0$ to 200 kHz-1 MHz. Low single pulse energy $l_1$ of 0.1-1 μJ, low laser scanning speed $v_1$ and small scanning spacing $d_1$ are selected as processing parameters which used for scanning from the edge of the structure obtained in step 1), and meets the requirement of: $0 \le$ $$\left(1 - \frac{v_1}{l_0 \times f_0}\right) \times 100\% < 1 \text{ and } 0 \le \left(1 - \frac{d_1}{l_0}\right) \times 100\% < 1,$$

the combination of process parameters with low single pulse energy, low laser scanning speed and small scanning spacing can realize the precipitation of Ga metal nanoparticles between GaN film and rigid transparent substrate without any separation or damage, at the same time, the release rate of gas products produced by GaN decomposition is slowed down, and the influence of gas products on the distribution uniformity of Ga metal nanoparticles is reduced;

4) Laser pulse width, wavelength and pulse frequency are selected the same as described in step 3). High single pulse energy $I_2$ of 1-2 μJ, high laser scanning speed $v_2$ and large scanning spacing $d_2$ are selected as processing parameters which used for scanning in the reverse direction along the scan path in step 3), and meets the requirement of:

$$\left(1 - \frac{v_2}{l_0 \times f_0}\right) \times 100\% < 0 \text{ and } \left(1 - \frac{d_2}{l_0}\right) \times 100\% < 0,$$

high single pulse energy can rapidly release the decomposition gas products of GaN, which is beneficial to destroy the micro connection between GaN film and rigid transparent substrate, and realize the separation of the interface between GaN film and rigid transparent substrate. High scanning speed and large scanning spacing can reduce the overlap rate between pulse points, and reduce the interference of gas product coupling between adjacent pulse points on the distribution of Ga metal nanoparticles formed in step 3). Reverse scanning can further homogenize the distribution of Ga metal nanoparticles precipitated in step 3);

5) Remove the rigid transparent substrate separated by laser scanning to obtain the Ga metal nanoparticle/GaN film/flexible substrate structure;
6) Interdigital electrodes are prepared on the surface of Ga metal nanoparticles in the structure obtained in step 5) to obtain a flexible GaN photodetector.

Further, in step 3), the laser wavelength should be selected in the range where its photon energy is less than the band gap of the corresponding rigid transparent substrate.

Further, in step 6), the material of the interdigital electrode is a metal with a metal work function higher than the semiconductor affinity of the GaN and forms a Schottky contact with the GaN film.

Compared with the prior art, the present invention has the beneficial effects of: it provides a laser rapid fabrication method for flexible GaN photodetector. By using laser technology to transfer GaN films on rigid substrates to flexible substrates rapidly with high quality, the rapid fabrication of flexible GaN photodetector is realized. In addition, through the regulation of the laser process, the surface of the detector is covered with uniformly distributed Ga metal nanoparticles, which further enhances the light absorption and light response capabilities of the detector. The invention optimizes device performance on the basis of simplifying fabrication process of the flexible GaN photodetector, and is suitable for large-scale batch industrial production.

DESCRIPTION OF DRAWINGS

FIG. 1(e) is a schematic cross-sectional view of the flexible GaN photodetector provided by the present invention;

Where, 1. rigid transparent substrate, 2. GaN epitaxial wafer, 3. Ga metal nanoparticles, 4. interdigital electrode, 5. flexible substrate, 6. ultrafast laser beam.

PREFERRED EMBODIMENTS

In order to make the purposes, technical schema and advantages of the present invention clearer, the technical schema of the present invention will be described clearly and completely below with the embodiments and the accompanying drawings. Obviously, the described embodiments are one embodiment of the invention and not all embodiments. Based on the embodiments of the present invention, all other embodiments obtained by those of ordinary skill in the art without creative efforts shall fall within the protection scope of the present invention.

Embodiment 1

Figure 1:
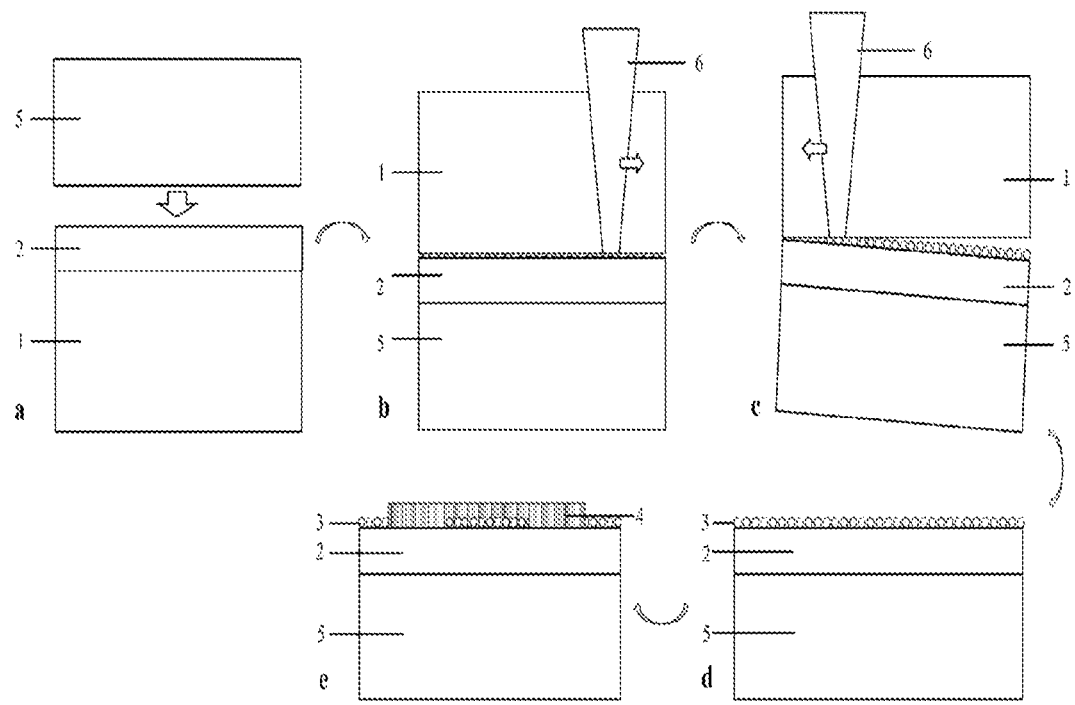
FIG. 1 includes FIGS. 1(a), 1(b), 1(c), 1(d) and 1(e) showing a flow diagram of the laser rapid fabrication method for flexible GaN photodetector provided by the present invention.
Figure 2:
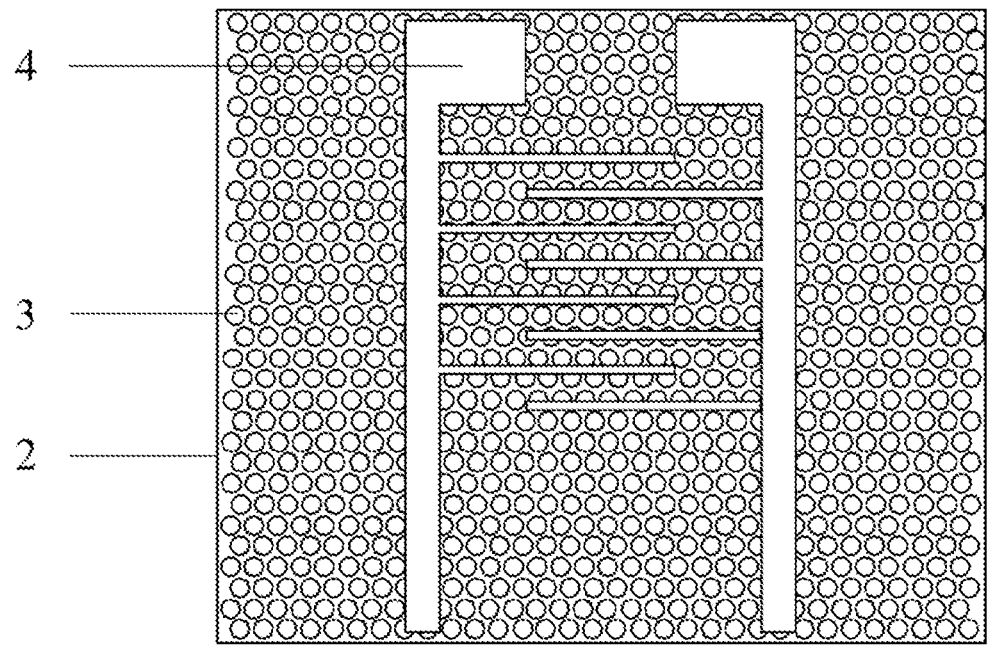
FIG. 2 is a schematic top view of a flexible GaN photodetector provided by the present invention.

Referring to FIG. 1, a laser rapid fabrication method for a flexible GaN photodetector provided in this embodiment includes the following steps:
1) Bonding the thermal release tape flexible substrate and the sapphire GaN film epitaxial wafer to obtain a sapphire substrate/GaN film/thermal release tape flexible substrate structure;
2) The sapphire substrate/GaN film/thermal release tape flexible substrate structure described in step 1) is put on a processing table with a fixed height below the light outlet, and the focal plane of the laser beam is arranged between the interface of sapphire substrate and the GaN film. Since the thickness of GaN epitaxial layer used is 4 μm, and the thickness of the thermal release tape flexible substrate is 500 μm, the focus position is set to 504 μm on the processing table, and the beam is incident from the sapphire substrate side, and the spot size is 10 μm.
3) Since the sapphire substrate has a high transmittance to short-wavelength laser beams, a laser beam with a pulse width of 10 picoseconds ($10^{-12}$ s) was selected at 355 nm. The energy distribution of the beam is an ordinary circular spot Gaussian beam, adjust beam energy to 0.5 μJ, the repetition frequency is 250 kHz, the scanning speed is 100 mm/s, the scanning path of the laser beam is line scanning filling, and the scanning spacing is 8 μm. Start scanning and irradiating from the edge of sapphire substrate/GaN film/thermal release tape structure obtained in step 1), thereby inducing in-situ growth of Ga metal nanoparticles at the interface between the GaN film and the sapphire substrate.
4) Laser pulse width, wavelength and pulse frequency are selected the same as described in step 3). The single pulse energy is adjusted to 1.5 μJ, the scanning speed is 3500 mm/s, and the scanning spacing is 20 μm. Starting point of the scanning path is set as the end point of the scanning path in step 3), and scanning is performed in the reverse direction along the path in step 3).
5) After scanning, remove the sapphire substrate. At this point, a GaN film/thermal release tape flexible substrate structure is obtained, and the surface of the GaN film is covered with uniformly distributed Ga metal nanoparticles;
6) Au interdigital electrodes are evaporated on the surface of Ga metal nanoparticles obtained in step 5), and the thickness of the electrodes is 80 nm, so as to form Schottky contact with the structure obtained in step 5), that is, a flexible GaN photodetector with an average size of Ga metal nanoparticles on the surface of 160 nm is prepared. The flexible gallium nitride photodetector, compared with the GaN photodetector formed by Schottky electrode evaporation directly on a rigid substrate, its light response intensity for 280-400 nm band is improved, and the response peak appears at 350 nm, which is increased by 28 times.

Embodiment 2

Referring to FIG. 1, a laser rapid fabrication method for a flexible GaN photodetector provided in this embodiment includes the following steps:
1) Bonding the PET flexible substrate and the sapphire GaN film epitaxial wafer to obtain a sapphire substrate/GaN film/PET flexible substrate structure;
2) The sapphire substrate/GaN film/PET flexible substrate structure described in step 1) is put on a processing table with a fixed height below the light outlet, and the focal plane of the laser beam is arranged between the interface of sapphire substrate and the GaN film. Since the thickness of GaN epitaxial layer used is 4 μm, and the thickness of the PET flexible substrate is 250 μm, the focus position is set to 254 μm on the processing table, and the beam is incident from the sapphire substrate side, and the spot size is 10 μm.

3) Since the sapphire substrate has a high transmittance to short-wavelength laser beams, a laser beam with a pulse width of 10 picoseconds ($10^{-12}$ s) was selected at 355 nm. The energy distribution of the beam is a circular spot flat-top beam, adjust beam energy to 0.7 µJ, the repetition frequency is 250 kHz, the scanning speed is 100 mm/s, the scanning path of the laser beam is line scanning filling, and the scanning spacing is 5 µm. Start scanning and irradiating from the edge of sapphire substrate/GaN film/PET structure obtained in step 1), thereby inducing in-situ growth of Ga metal nanoparticles at the interface between the GaN film and the sapphire substrate.
4) Laser pulse width, wavelength and pulse frequency are selected the same as described in step 3). The single pulse energy is adjusted to 1.8 µJ, the scanning speed is 3000 mm/s, and the scanning spacing is 15 µm. Starting point of the scanning path is set as the end point of the scanning path in step 3), and scanning is performed in the reverse direction along the path in step 3).
5) After scanning, remove the sapphire substrate. At this point, a GaN film/PET flexible substrate structure is obtained, and the surface of the GaN film is covered with uniformly distributed Ga metal nanoparticles;
6) Au interdigital electrodes are evaporated on the surface of Ga metal nanoparticles obtained in step 5), and the thickness of the electrodes is 80 nm, so as to form Schottky contact with the structure obtained in step 5), that is, a flexible GaN photodetector with an average size of Ga metal nanoparticles on the surface of 80 nm is prepared. The flexible gallium nitride photodetector, compared with the gallium nitride photodetector formed by Schottky electrode evaporation directly on a rigid substrate, its light response intensity for 280-400 nm band is improved, and the response peak appears at 350 nm, which is increased by 35 times.

The above embodiment 1 and embodiment 2 are only examples, wherein the selection of rigid transparent substrate and flexible substrate, the setting of various parameters of laser beam are only examples, and not limitations of the present invention. For example, PI or PDMS can also be selected for flexible substrates, SiC can also be selected for rigid transparent substrates, and Pt can be selected for interdigital electrode materials.

We claim:

1. A laser rapid fabrication method for flexible gallium nitride (GaN) photodetector, comprising the following steps:
step (1) providing a GaN epitaxial wafer which comprises a GaN film and a rigid transparent substrate, bonding a flexible substrate to the GaN film to obtain a rigid transparent substrate/GaN film/flexible substrate structure;
step (2) placing the rigid transparent substrate/GaN film/flexible substrate structure on a processing table with a fixed height below a light outlet, providing a laser beam incident from a side of the rigid transparent substrate, adjusting a focus of the laser beam so that a focal plane of the laser beam is located within a range of 0.2 mm from an interface between the rigid transparent substrate and the GaN film in the rigid transparent substrate/GaN film/flexible substrate structure described in step (1), a spot size $l_0$ of the laser beam is 5-100 µm;
step (3) selecting laser wavelength in the range of 250-1200 nm, and selecting a ultrafast laser with pulse width less than or equal to $10^{-12}$ s, setting laser pulse frequency $f_0$ to 200 kHz-1 MHz; selecting low single pulse energy $I_1$ of 0.1-1 µJ, low laser scanning speed $v_1$ and small scanning spacing $d_1$ as processing parameters, scanning the rigid transparent substrate/GaN film/flexible substrate structure obtained in step (1) with the laser beam, the scanning starts from an edge of the rigid transparent substrate/GaN film/ flexible substrate structure and proceeds along a scan path, where $l_0$, $f_0$, $v_1$ and $d_1$ meet the requirement of:

$$0 \le \left(1 - \frac{v_1}{l_0 \times f_0}\right) \times < 100\% < 1 \text{ and } 0 \le \left(1 - \frac{d_1}{l_0}\right) \times 100\% < 1,$$

upon scanning, GaN at the interface between the GaN film and the rigid transparent substrate is decomposed and Ga metal nanoparticles are precipitated at the interface by irradiation of the laser beam to obtain a rigid transparent substrate/GaN film/flexible substrate structure having Ga metal nanoparticles;
step (4) selecting the same pulse width, the same laser wavelength and the same laser pulse frequency as those in step (3); selecting high single pulse energy $I_2$ of 1-2 µJ, high laser scanning speed $v_2$ and large scanning spacing $d_2$ as processing parameters, scanning the rigid transparent substrate/GaN film/flexible substrate structure having Ga metal nanoparticles with the laser beam in a reverse direction along the scan path in step (3), where $l_0$, $f_0$, $v_2$ and $d_2$ meet the requirement of:

$$\left(1 - \frac{v_2}{l_0 \times f_0}\right) \times 100\% < 0 \text{ and } \left(1 - \frac{d_2}{l_0}\right) \times 100\% < 0,$$

separating the GaN film and the rigid transparent substrate from the interface between the GaN film and the rigid transparent substrate;
step (5) removing the rigid transparent substrate separated in step (4) to obtain a Ga metal nanoparticle/GaN film/flexible substrate structure;
step (6) forming interdigital electrodes on a surface of the Ga metal nanoparticles in the Ga metal nanoparticle/GaN film/flexible substrate structure obtained in step (5) to obtain the flexible GaN photodetector.

2. The laser rapid fabrication method for flexible GaN photodetector according to claim 1, wherein in step (3), the laser wavelength is selected in a range where its photon energy of the laser beam is less than a band gap of the rigid transparent substrate.

3. The laser rapid fabrication method for flexible GaN photodetector according to claim 1, wherein in step (6), a material of the interdigital electrodes is a metal with a metal work function higher than semiconductor affinity of GaN and forms a Schottky contact with the GaN film.

* * * * *